United States Patent [19]

Petschacher et al.

[11] Patent Number: 4,563,669
[45] Date of Patent: Jan. 7, 1986

[54] INTEGRATED DIGITAL/ANALOG CONVERTER

[75] Inventors: Reinhard Petschacher, Villach; Werner Luschnig, S. Magdalen, both of Austria

[73] Assignee: Siemens Aktiengesellschaft, Berlin and Munich, Fed. Rep. of Germany

[21] Appl. No.: 569,131

[22] Filed: Jan. 9, 1984

[30] Foreign Application Priority Data

Jan. 31, 1983 [DE] Fed. Rep. of Germany ....... 3303117

[51] Int. Cl.$^4$ ............................................. H03K 13/02
[52] U.S. Cl. ............................................. 340/347 DA
[58] Field of Search ................. 340/347 DA; 307/362

[56] References Cited

U.S. PATENT DOCUMENTS 4,383,248 5/1983 Smith ........................... 340/347 DA Primary Examiner—Charles D. Miller
Attorney, Agent, or Firm—Thomas H. Jackson

[57] ABSTRACT

A D/A converter that operates according to the parallel method, in which each of the conversion stages assigned to a given bit of the digital word to be converted has, in the conventional manner a current source that delivers a weighted constant current and an electronic switch with an output which is applied to the common output of the converter and which is controlled according to the command given by the control bit assigned to each particular stage. In order to prevent the errors in the output signal that occur in the customary D/A converters of this kind as a result of the differing response times of individual switches, each individual switching stage is controlled by a differential signal, in which the switching time for the rising edges is adjusted to be different from that for the falling edges. The source for the differential signal consists of an ECL flip-flop with another differential stage, which operates with the same load resistances as the flip-flop, in which case an additional direct current is introduced in the differential signal.

18 Claims, 5 Drawing Figures

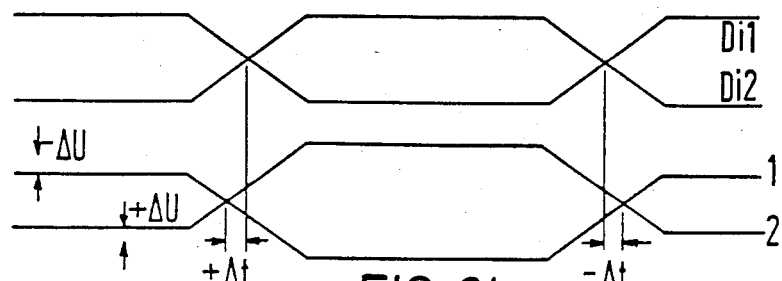

INTEGRATED DIGITAL/ANALOG CONVERTER

BACKGROUND OF THE INVENTION

This invention relates to an integrated digital/analog converter, with an input signal which accepts digital data lines which are to be converted to an analog signal output corresponding to the magnitude of the input signal.

Every bit of the digital input signal is designed to control a specific electronic switch which handles a specific constant current. The constant current delivered by a specific constant current source is binarily weighted in such a manner that the value of the constant currents conducted through the individual switches correspond in each case to the value of the corresponding bit in the digital signal to be converted. Each of these switches—which are identical to one another—consists of a differential amplifier, in which identical transistors are arranged together, with their current input terminals connected to a respective constant current source. The switches are controlled at their control terminals by a respective bit of the digital data lines in such a manner that for a control bit corresponding to the logic "1" state, the constant current generated by the respective constant current source is switched for all these switches to a common signal output that is related to the analog signal to be generated, while for a control bit corresponding to the logic "0" state, the constant current is applied to another common signal output or to the base of the respective constant current source.

In an embodiment of a conventional digital/analog converter of this kind, the weighting of individual constant currents is made possible by the corresponding measurement of the constant current source that generates them and it is realized by a specific transistor, in particular, by symmetrical current switching. In a familiar embodiment of this kind, the electronic switch which is controlled by the LSB (least significant bit) of the digital data signals is attached to a constant current source which consists of a transistor with an emitter, in which the emitter is connected to a reference potential and the base to a control potential that is common to all the constant current sources. To the switch controlled by the bit with the next lower value there is then connected a transistor with two emitters, which delivers a current that is doubled with respect to the first current source. The bit with the next lower value, to which is assigned a constant current with a quadruple value has a transistor with four emitters as a constant current source, etc. It is, of course, also possible to connect a number of identical transistors that corresponds to the required weight factor in parallel with one another; they will deliver the weighted current at their common output. This method is of particular interest when dealing with a circuit of the D/A converter that consists of MOS field effect transistors of the enhancement type, particularly when the transistors are identical.

On the other hand, it is also possible to use with each individual switch a specific constant current source, which, in and of itself, delivers the same current at the other constant current sources. The weighting is then accomplished by an appropriate resistance network, which connected the constant current delivered by the individual constant current sources through the converter that is assigned to each one with the common output in various ways and by this means achieve the desired weighting.

In summary, it can be stated that in the digital/analog converters corresponding to the definition given above, weighted currents are switched to or from the output thus generating the desired analog signal, according to the respective input data (that is, the digital signal that is to be converted). In this case, however, experience has shown that as the result of non-simultaneous activation of the switches current peaks or current drops are unintentionally produced which can sometimes degenerate the output analog signal. This phenomenon is known as the GLITCH effect. It can be reduced by a balanced layout of the integrated circuits that make up the D/A converter but it cannot be completely eliminated.

SUMMARY OF THE INVENTION

It is an object of the present invention to provide a digital/analog converter (DAC) which avoids the GLITCH effect.

This object, as well as others, are achieved by providing a DAC in which each of the switches ($U_i$; i=1, 2. . . ) conducting the weighted constant currents is comprised of a combination of six identical transistors. A first transistor and a second transistor (of the six transistors) are joined by cross-coupling to form an RS flip-flop. In addition, the current output electrode of the two transistors forming the flip-flop is connected in each case through a load resistance with a supply terminal that delivers a first supply voltage and to respective current output electrode of two more of these transistors. At the same time the current input electrodes of the two transistors forming the flip-flop are jointly driven by a first strobe signal and the current input electrodes of each one of the two transistors that are each connected through their current output electrodes with one of the two signal terminals of the flip-flop are driven by a common second strobe signal. The control electrodes of one of the two last mentioned transistors is controlled by the respective bit of the digital signal that is to be processed that is assigned to a respective switch while the control electrode of the other of these two transistors is driven by a reference voltage derived from a reference potential supplied by another supply terminal. Furthermore, the control electrodes of the two last transistors, which are each connected with one of the two signal terminals of the flip-flop, are each driven by another reference voltage, while their current input electrode is connected—in particular, through the insertion of a resistance in each case—to the output of a common current source, whose base comprises the supply terminal for the refernce potential. Finally, the two signal outputs are each connected to one of the two control inputs of the respective switch in such a manner that the constant current conducted through the switch only arrives at the common analog output if the bit that controls the switch through the flip-flop has a value of "1".

Other features and advantages of the invention will be apparent from the following description of the preferred embodiments and from the claims.

For a full understanding of the present invention, reference should now be made to the following detailed description of the preferred embodiments of the invention.

BRIEF DESCRIPTION OF THE DRAWINGS

FIG. 3 comprises the related timing diagrams, FIGS. 3a and 3b;

FIG. 3a shows differential signals Di1, and Di2, their crossovers showing the switching time of the present circuit while FIG. 3b shows the time relationship of U to FIG. 3a.

DETAILED DESCRIPTION

Preferred embodiments of the invention will now be described with reference to the figures.

Figure 1:
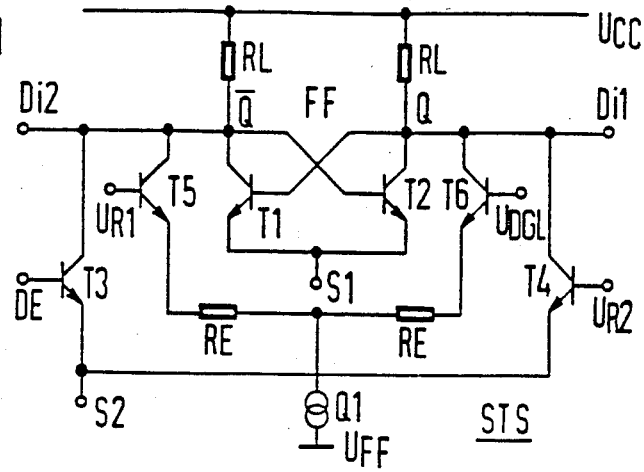
FIG. 1 shows the present ECL-Latch circuit comprising the six transistors that is used for driving the individual switches.
Figure 2:
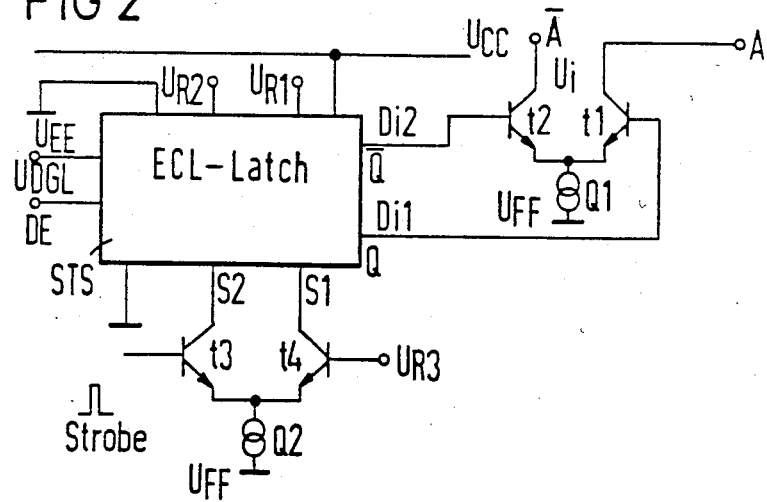
FIG. 2 shows the connection of the present ECL-Latch circuit of FIG. 1 with a conventional switch, as well as details of the necessary strobe signals.

The transistors used in a preferred embodiment of the invention that is presented in FIG. 1 and FIG. 2 are bipolar n-p-n transistors. Obviously it is also possible to replace the n-p-n transistors by p-n-p transistors. Another possibility is to use field effect transistors, in particular, normally off MOSFET's (Metal Oxide Semiconductor Field Effect Transistor).

The flip-flop FF which is commonly used in ECL technology, consists of two n-p-n transistors T1 and T2, with the emitters of the two transistors being connected directly with one another, while the base of each one of two transistors T1 and T2 is connected directly to the collector of the other transistor, T2 or T1. Pursuant to the above definition, the emitter is the current input electrode, the collector is the current output electrode and the base or its terminal is the control electrode. When field effect transistors are used, the source terminal is the current input electrode, the drain terminal is the current output electrode and the gate is the control electrode.

In the example shown in FIG. 1, the collector of the first transistor T1 is simultaneously the $\overline{Q}$ output, and the collector of the second transistor T2 is simultaneously the Q output of the RS flip-flop FF. Both outputs are connected through respective load resistances RL with the supply terminal to the first supply voltage $U_{CC}$. The non-inverting output Q delivers a signal "Di1" and the inverting output $\overline{Q}$, a signal "Di2" that is the complement of "Di1". These two signals are used in the manner shown in FIG. 2 to control the respective electronic switch $U_i$.

The bit of the digital signal that is to be evaluated which controls the current switch in question is fed into the data input DE, which comprises the base of another n-p-n transistor T3. The collector of this n-p-n transistor is directly connected to the collector of the first n-p-n transistor T1 and thereby to the inverting output $\overline{Q}$ of the flip-flop FF. Another n-p-n transistor T4, corresponding to the transistor T3, is connected at its base to reference voltage $U_{R2}$ (reference potential (ground)) and is also connected by its collector directly to the collector of the second transistor T2 of the RS flip-flop and thereby with the non-inverting signal output Q of the flip-flop. The emitters of the third transistor T3 and the fourth transistor T4 are jointly connected to a first strobe signal S2. A second strobe signal S1, which is inverted with respect to the first strobe signal, serves to drive the emitters of the two transistors T1 and T2 that form the flip-flop FF. A fifth n-p-n transistor T5 is likewise connected directly by its collector to the inverting output $\overline{Q}$ of the flip-flop FF, and corresponding to it, a sixth n-p-n transistor T6 is connected by its collector to the output Q of the abovementioned flip-flop FF which generates the non-inverted signal. Both transistors T5 and T6 are connected through respective emitter resistances RE to the current-supplying output of a common constant current source Q1, whose base is conneced to the reference potential $U_{EE}$. The constant current source Q1 is not one of the constant current sources connected to the individual switches U1, U2, .... It consists, in a familiar form, of a transistor, which might be connected in symmetrical current switching, whose emitter is connected to the supply terminal for the reference potential $U_{EE}$, and whose collector is connected through the two resistances RE to one of the two transistors T5 and T6, as has already been explained above.

Finally, it is to be noted that the base of the transistor T5 at the output $\overline{Q}$ of the flip-flop FF is driven by a reference voltage $U_{R1}$, and the base of the transistor T6 by a variable voltage $U_{DGL}$ (based on the reference potential $U_{EE}$). It is the goal of the invention to have each of the switches $U_i$ ($i=1, 2, \ldots$) be controlled by a differential signal Di1 or Di2, as can be seen from FIG. 2. In this case the differences in switching behavior of the individual switches, which cause the GLITCH effect, are to be compensated for by making different adjustments in the switching time for the rising and falling edges of the differential signals Di1 and Di2 that are shown in the timing diagram according to FIG. 3. The switching time is given by the crossing point of the two signals Di1 and Di2 (i.e., the time when the two potential Di1 and Di2 have the same value). While in the diagram given in FIG. 3a, both signals are equal to one another with respect to their time differential at every moment. According to FIG. 3b, in accordance with the invention, the crossing point is shifted in time, as compared with the situation in FIG. 3a, by a voltage $U_{DGL}$ applied externally, in such a manner that when the circuit is activated (=faster procedure) it occurs later, by a time internal $\Delta t$, and when the circuit is open it comes earlier, by the same time interval. $\Delta t$. This is achieved by a redistribution of the DC voltage proportion of the two differential signal potentials Di1 and Di2, by the value $\Delta U$ (FIG. 3b).

The ECL-Latch circuit STS shown in FIG. 1 that makes this characteristic possible uses, as a source for the differential signals Di1 and Di2, an ECL flip-flop FF. In this case, an additional direct current is introduced through another differential step, which consists of the two transistors T5 and T6, and which operated with the same load resistance value as the RL resistance used for the flip-flop FF. If this direct current is distributed asymmetrically, then the levels of the differential signals Di1 and Di2 are shifted in opposite directions. The distribution of this direct current can be adjusted continuously by changing $U_{DGL}$. In order to reduce the sensitivity of this adjustment, larger emitter resistances RE can be provided.

The digital data word that forms the digital signal that is to be converted should first be fed in parallel into a memory, in which a number of successive memory cells are each connected at their data output with a separate circuit like that shown in FIG. 1, through its data input DE, namely the base of the transistor T3. In doing so, care is taken to ensure that the value i of the bit of the digital signal to be evaluated which controls the data input DE is in agreement with the value, obtained as a result of the weighting, of the electronic switch $U_i$ that is controlled through the data input by the respective circuit STS shown in FIG. 1. The control, shown in FIG. 2 of the switch $U_i$ formed from the two n-p-n transistors t1 and t2 connected to the two signal outputs Q and $\overline{Q}$, respectively of the flip-flop FF is such that the constant current that is conducted form the constant current source Q1 through the switch $U_i$ consisting of the differential amplifier formed from the two transistors t1 and t2 corresponds, with respect to its current magnitude to the value of the bit in the digital signal that is to be evaluated and which is applied to the input DE. In doing so, in accordance with the definition of the invention, care is taken above all to ensure that the differential signal Di1, corresponding to the logic state of the data bit present in each case at the input DE, controls the transistor T1, whose collector leads to the common signal output A intended for the analog signal that is to be generated. In the example shown in FIG. 2, the other transistor t2 of the switch $U_i$ leads to an inverted output $\overline{A}$. The transistor t2 is controlled by the differential signal Di2, which corresponds in its logic state to the inverted control bit. The output $\overline{A}$ is likewise common to all these switches $U_i$ and can consist, for example, of the terminal for the reference potential $U_{EE}$. Another differential amplifier, consisting of the two n-p-n transistors t3 and t4, as well as a constant current source Q2, in the manner shown in FIG. 2, is provided to generate the two strobe signals S1 and S2. In this case, one of the transistors, whose collector supplies the strobe signal S2 for the control of the two transistors T3 and T4, is controlled by a clock pulse designated as "strobe", and the other transistor t4, by a third reference voltage $U_{R3}$, which supplies the strobe signal S1 that is used to drive the emitter terminals of the transistors T1, T2 that form the flip-flop FF.

The constant current source Q2 that is provided for supplying the differential amplifier t3/t4 that supplies the two strobe signals S1 and S2 and which connects the amplifier to the reference potential $U_{EE}$ is equivalent, by its characteristics, to the constant current source Q1 in FIG. 1 (which accordingly forms part of the ECL-Latch circuit section STS, which is shown in FIG. 2).

With regard to the measurement of the reference voltage(s) that are provided to control the transistors T4, T5, T6 and t4, the following observations must be made.

(a) It is desirable to apply the reference voltage $U_{DGL}$, that is provided to control the transistor T6, from an external source, such as a potentiometer for example, and to measure it according to the guidelines given above.

(b) The reference voltage $V_{R1}$ used to control the transistor T5 is generated internally by means of a voltage distributor.

(c) The reference voltage $U_{R2}$ used to control the transistor T4 is obtained from an ECL reference voltage (usually $-1.29$ V) by obtaining a voltage drop of one diode.

(d) The reference voltage $U_{R3}$ used to generate the first strobe signal S1 is adjusted in such a manner that, as above, it is lower than $U_{R3}$ by the voltage drop of one diode.

In conclusion, it should be noted that the circuit shown in FIG. 1 and in FIG. 2 can also be constructed from other transistors. Since D/A converters corresponding to the definition given at the outset can also be manufactured in one channel MOS technology (as already indicated above) it may be desirable to construct the circuit in accordance with the invention in the corresponding MOS technology as well, in which case the transistors should be MOSFETs of the enhancement type that have the same kind of channel.

There has thus been shown and described a noval digital to analog converter (DAC) which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. In an integratable digital/analog converter with a digital input signal to be converted and a signal output that provides an analog signal that is the product of the conversion, in which every bit of the digital input signal controls a specific electronic switch for a specific constant current, in which the constant current is delivered by a specific constant current source which is binarily weighted in such a manner that the significance of the specific constant current conducted through individual switches corresponds in each case to the value of the bit in the digital input signal, in which, in addition, each of these switches which are identical to one another comprises a differential amplifier which further comprises identical transistors which have their current input electrodes, driven by the respective specific constant current source and which are controlled at their control electrodes by the respective bit to be evaluated in such a manner that for a control bit corresponding to the logic "1" state, the specific constant current generated by the respective constant current source is switched for all these switches to a common signal output that is responsible for the analog signal that is to be generated, while for a control bit corresponding to the logic "0" state, the constant current is applied instead to another common signal output, the improvement wherein:

each of said switches conducting said specific constant currents comprises a combination of six identical transistors, a first and a second transistor of said six identical transistors being cross-coupled to form an RS flip-flop, the current output electrode of said first and second transistors being connected in each case through a load resistance (RL) to a supply terminal that delivers a first supply potential ($U_{CC}$) and, in addition, to a respective current output electrode of two more of said six transistors the current input electrodes of said first and second transistors being jointly driven by a first strobe signal (S1), the current input electrodes of each one of said two more transistors being connected through their current output electrodes with one of two signal terminals (Q, $\overline{Q}$) of said flip-flop (FF) and being driven by another common strobe signal (S2), the control electrode of one of said two more transistors being controlled by the respective bit of said digital input signals that is assigned to said switch ($U_i$), and the control electrode of the other of said two more transistors being driven by a reference voltage ($U_{R2}$) which is derived from a reference potential ($U_{EE}$) supplied by another supply terminal, control electrodes of two last transistors of said six identical transistors being connected to one of said two signal terminals (Q, $\overline{Q}$) of said flip-flop (FF), said two last transistors being connected through a resistance (RE) in each case to the output of a common current source (Q1) whose base comprises a supply terminal for a reference potential ($U_{FF}$), said two signal terminals (Q, $\overline{Q}$) of said flip-flop being connected to one of the two control inputs of the respective switch ($U_i$) in such a manner that said constant current conducted through said switch ($U_i$) only arrives at a common analog signal output to be generated if the bit that controls said switch ($U_i$) through said flip-flop (FF) has a value of "1".

2. Digital/analog converter according to claim 1, wherein said control electrodes of said two last transistors are combined to form a differential amplifier through the connection of their current input electrodes with the output of said constant current source (Q1) and are driven in such a manner that the one of these two transistors has its current output electrodes at its inverting output ($\overline{Q}$) and consequently at the current output electrode of one of said two more transistors (T3) that is driven by the control bit, said one of these transistors being controlled by a DC control voltage ($U_{DGL}$) that is to be adjusted externally, and the other of said last two transistors being driven by a fixed reference voltage ($U_{R2}$).

3. Digital/analog converter according to claim 2, wherein said first strobe signal (S1) and said common strobe signal (S2) are the inverse of one another.

4. Digital/analog converter according to claim 3, wherein said converter further comprises a differential amplifier for generating said first and common strobe signals (S1, S2) said differential amplifier having two transistors (t3, t4) connected together by means of their current source (Q2), in which the control electrode of one of said two transistors (t3) is driven by a clock signal and the control electrode of the second of said two transistors (t4), by a DC reference voltage ($U_{R3}$), and in which said one of said two transistors, (t3) is directly connected with its current output electrode to the current input electrode of said one of said two more transistors (T3) that is driven by said control bit, and the other of said two transistors (t4) is driven with said reference voltage and is connected with its current output electrode directly to the current input electrodes of said first and second transistors forming said flip-flop (FF).

5. Digital/analog converter according to claim 4, wherein said identical transistors comprise bipolar transistors of npn type.

6. Digital/analog converter according to claim 4, wherein said identical transistors comprise MOS field effect transistors of the enhancement type.

7. Digital/analog converter according to claim 3, wherein said identical transistors comprise bipolar transistors of npn type.

8. Digital/analog converter according to claim 3, wherein said identical transistors comprise MOS field effect transistors of the enhancement type.

9. Digital/analog converter according to claim 2, wherein said identical transistors comprise bipolar transistors of npn type.

10. Digital/analog converter according to claim 2, wherein said identical transistors comprise MOS field effect transistors of the enhancement type.

11. Digital/analog converter according to claim 1, wherein said first strobe signal (S1) and said common strobe signal (S2) are the inverse of one another.

12. Digital/analog converter according to claim 11, wherein said converter further comprises a differential amplifier for generating said first and common strobe signals (S1, S2) said differential amplifier having two transistors (t3, t4) connected together by means of their current source (Q2), in which the control electrode of one of said two transistors (t3) is driven by a clock signal and the control electrode of the second of said two transistors (t4), by a DC reference voltage ($U_{R3}$), and in which said one of said two transistors, (t3) is directly connected with its current output electrode to the current input electrode of said one of said two more transistors (T3) that is driven by said control bit, and the other of said two transistors (t4) is driven with said reference voltage and is connected with its current output electrode directly to the current input electrodes of said first and second transistors forming said flip-flop (FF).

13. Digital/analog converter according to claim 12, wherein said identical transistors comprise bipolar transistors of npn type.

14. Digital/analog converter according to claim 12, wherein said identical transistors comprise MOS field effect transistors of the enhancement type.

15. Digital/analog converter according to claim 11, wherein said identical transistors comprise bipolar transistors of npn type.

16. Digital/analog converter according to claim 11, wherein said identical transistors comprise MOS field effect transistors of the enhancement type.

17. Digital/analog converter according to claim 1, wherein said identical transistors comprise bipolar transistors of npn type.

18. Digital/analog converter according to claim 1, wherein said identical transistors comprise MOS field effect transistors of the enhancement type.

* * * * *